United States Patent [19]
Kuck et al.

[11] Patent Number: 5,617,039
[45] Date of Patent: Apr. 1, 1997

[54] AUXILIARY POWER UNIT TESTING DEVICE

[75] Inventors: Burton M. Kuck; Danial T. Thomas, both of Escondido, Calif.

[73] Assignee: Applied Data Technology, San Diego, Calif.

[21] Appl. No.: 337,044

[22] Filed: Nov. 10, 1994

[51] Int. Cl.$^6$ .............................. F01R 31/00; G06F 15/20
[52] U.S. Cl. ..................... 324/771; 324/73.1; 324/158.1; 364/424.04
[58] Field of Search ................................ 324/158.1, 73.1, 324/537; 364/424.04, 424.03, 571.01; 340/648, 945, 963, 550; 60/39.07, 39.29; 415/48, 155, 182.1; 244/194, 195

[56] References Cited

U.S. PATENT DOCUMENTS

| | | | |
|---|---|---|---|
| 3,764,814 | 10/1973 | Griffith | 60/39.16 |
| 5,033,010 | 7/1991 | Lawrence et al. | 364/424.04 |
| 5,079,707 | 1/1992 | Bird et al. | 364/424.04 |
| 5,146,160 | 9/1992 | Pinkston | 324/537 |
| 5,235,803 | 8/1993 | Rodgers | 60/39.07 |

*Primary Examiner*—Vinh P. Nguyen
*Attorney, Agent, or Firm*—John R. Ross

[57] ABSTRACT

A a testing device for testing aircraft auxiliary power units. A special multiwire cable system electrically imposes certain test circuits in between the APU control station and the ESCU and imposes other test circuits in between the ESCU and the LRU's. LRU electrical circuits are subjected to short electrical pulses and the resulting current flow is monitored. Zero or very low current indicates an open or defective circuit and excess current flow indicates a short circuit. Circuit selector equipment permits easy monitoring of circuit resistance and signal characteristics using external standard test equipment. In a preferred embodiment, signal buffer circuits and signal latch circuits provide a record indicating if signals are transmitted to the APU LRU's. In this preferred embodiment the APU battery provides power for the testing device. This preferred embodiment does not include standard monitoring equipment such as voltmeters and oscilloscopes which would require calibration. But the device does provide jacks for permitting these devices to be easily connected to the APU electrical circuits. As a result the unit is small and weighs only about 10 pounds and standard electrical test equipment can be calibrated separately.

7 Claims, 10 Drawing Sheets

AUXILIARY POWER UNIT TESTING DEVICE

This invention relates to testing devices and especially to devices for testing aircraft equipment.

BACKGROUND OF THE INVENTION

There exists more that 60,000 aircraft in the world that have auxiliary power units (hereinafter, APU's) to provide auxiliary electric power to the instruments and other equipment on the aircraft and in many cases high volumes of low pressure compressed air to start jet engines. In most cases the aircraft cannot take off if the APU is not functioning properly. These units typically are very reliable but like all equipment they are subject to failure.

To determine the cause of a failure of an APU, maintenance personnel typically use standard electronic test equipment such as voltmeters, ammeters, and oscilloscopes. A typical APU is the Turbomach T40LC-2 APU (hereinafter, T40LC-2 APU) provided for the United States Air Force KC135R aircraft and other aircraft. There are about 586 of these units currently installed in operating aircraft. The value of these aircraft is as much as $10 million each and the total value of all of these aircraft is over $8 billion. If APU's in these very valuable aircraft are not working the aircraft does not take off.

The T40LC-2 APU

The T40LC-2 APU is supplied by Sundstrand Turbomach Corporation and supplies a very high volume of low pressure compressed air for onboard start of several types of jet aircraft. In addition, it provides auxiliary electric power for the aircraft. FIG. 1 is a drawing showing the location of principal components of the T40LC-2 APU on a typical aircraft. The principal components are power unit 2, control panel 4, crew entry start switch 6, and the pilot start control panel 8. Power unit 2 is shown in greater detail in FIG. 1A and control panel 4 is shown in greater detail in FIG. 1B. Elements of the power unit includes two turbine engines as shown at 10, two inlet ducts 12, two cooling ducts 14, one generator 16, and one low pressure compressed air exit duct 18 supplied by both engines through Y duct 20.

The two gas turbine engines, each drive a low pressure high volume compressor supplying input air for starting the aircraft main drive engines. Either of the APU's engines can be arranged to drive a generator which produces 400 Hz AC power for distribution through the aircraft's electrical system. The gas turbine engines use JP-4 fuel supplied by the aircraft's wing tank. The operation of the turbine engines is controlled by the electronic sequencing control unit (hereinafter, ESCU). Normal connections are shown in FIG. 6A. The ESCU provides the control signals necessary to operate the engine's servos, valves, and relays. This group of components of the T40LC-2 APU are individually replaceable in a maintenance operation; therefore, they are referred to as line replaceable units (hereinafter, LRU's). The ESCU also monitors engine operation using signals from several sensors mounted in the engine.

The T40LC-2 APU costs about $150,000. A special test device has been developed for the Air Force for testing this APU. It is known as the TTU469/E unit and currently sells for about $82,750. It weighs in excess of 75 pounds. It is difficult to maintain in good working condition. It comprises a number of built-in test instruments, each of which must be calibrated individually.

What is needed is a better, simpler, and more reliable device for testing APU's.

SUMMARY OF THE INVENTION

The present invention provides a testing device for testing aircraft auxiliary power units. A special multiwire cable system electrically imposes certain test circuits in between the APU control station and the ESCU and imposes other test circuits in between the ESCU and the LRU's. LRU electrical circuits are subjected to short electrical pulses and the resulting current flow is monitored. Zero or very low current indicates an open or defective circuit and excess current flow indicates a short circuit. Circuit selector equipment permits easy monitoring of circuit resistance and signal characteristics using external standard test equipment. In a preferred embodiment, signal buffer circuits and signal latch circuits provide a record indicating if signals are transmitted to the APU LRU's. In this preferred embodiment the APU battery provides power for the testing device. This preferred embodiment does not include standard monitoring equipment such as voltmeters and oscilloscopes which would require calibration. But the device does provide jacks for permitting these devices to be easily connected to the APU electrical circuits. As a result the unit is small and weighs only about 10 pounds and standard electrical test equipment can be calibrated separately.

DETAILED DESCRIPTION OF PREFERRED EMBODIMENTS

Elements to be Tested

In this preferred embodiment, we provide a device and method for testing the elements of the T40LC-2 APU. Specifically, we test the following elements of the T40LC-2 APU, all of which are LRU's:

Starter motor hydraulic valve
Start fuel solenoid valve and exciter circuit
Inlet guide vane (IGV)actuator
Fuel control servo
Surge (bypass) control valve
Main fuel solenoid valve
Fuel manifold purge solenoid valve
Battery

The APU Tester

Figure 3:
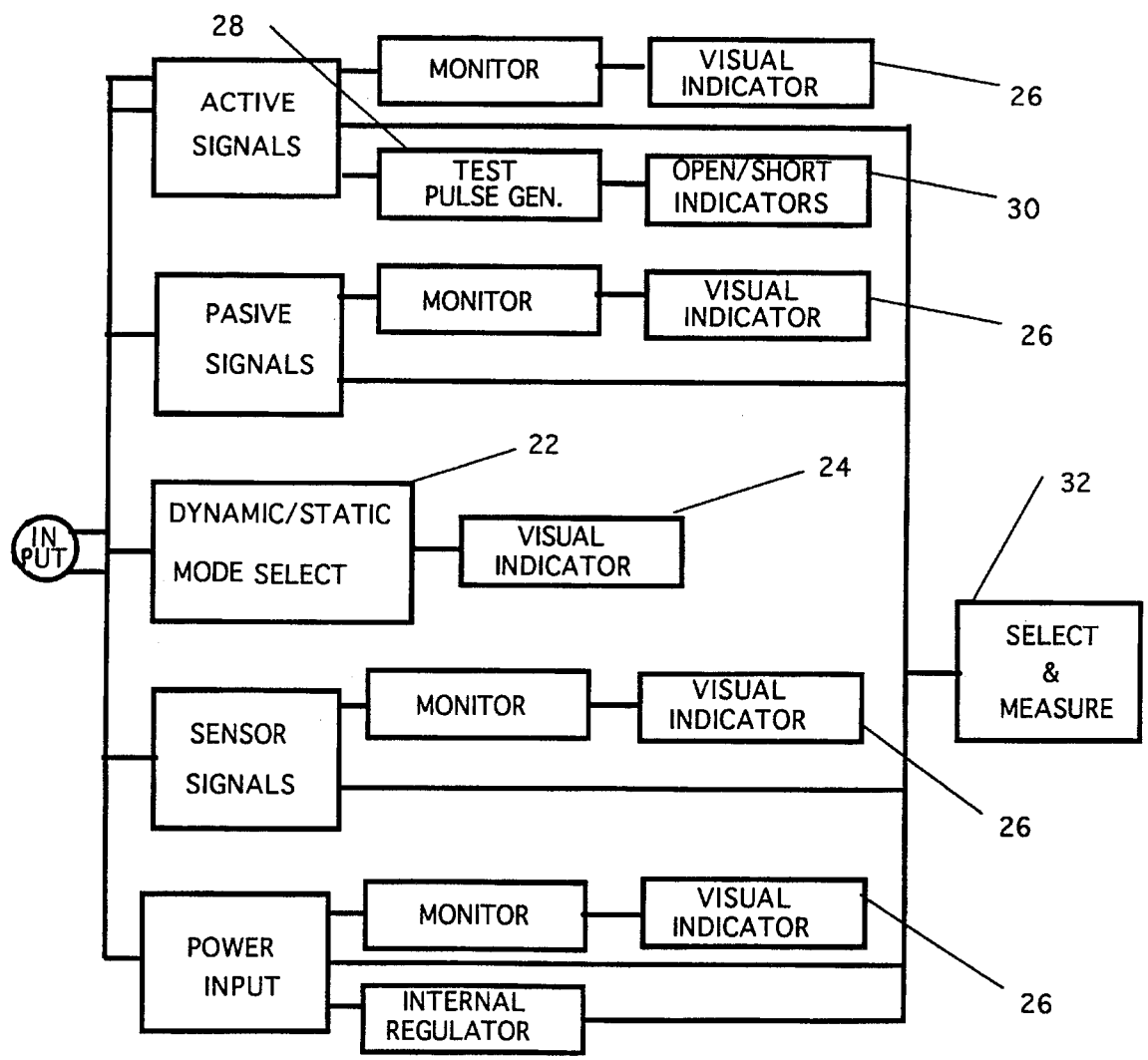
FIG. 3 is a block diagram showing some of the functions of the above embodiment.

Our device (hereinafter, the APU Tester) can be described by reference to FIGS. 3, 4A through 4E, 5, and 6A and B. Circuit interconnections among FIGS. 4A through 4E are indicated by on and off page designators. Each of these on and off page designators are a number inside a circle on one figure which corresponds to the same number in a circle on a separate figure. FIG. 4A through 4E are circuit diagrams of the tester. FIG. 6A shows how the auxiliary power unit is normally connected. FIG. 6B shows how to connect the tester in order to test the APU. FIG. 3 is a block diagram showing the principal elements of the APU tester. These elements include a mode select switch 22 with visual indication 24 of the selected mode, visual indicators 26 for monitoring all APU signals (active, passive, sensor, and power), a voltage test pulse generator 28 to indicate on indicators 30 the active signals for open or short circuits and a select switch 32 to select any APU signal for measurement using external test equipment.

The APU Tester provides the means to operationally monitor and test the electrical signals between the ESCU and each LRU. It permits a ready means of performing the initial fault isolation of any LRU of a failed T40LC-2 APU. While the APU Tester performs its testing of the APU by examining and exercising only electrical signals, this method will uncover problems of both electrical and electromechanical nature. This is due to the fact that the electrical signals monitored are often the outputs of sensors that are reporting the operating conditions of mechanical parts. In addition, the relay and servo signals that are exercised will indicate both electrical and electromechanical failures. This level of testing is adequate since the vast majority of APU failures are electrical or electromechanical in nature. When a defect in an LRU is identified, the defect can be repaired if the problem is obvious; or the LRU can be quickly replaced and repaired later; or, if repair is not appropriate, disposed of. Problems with the ESCU can also be identified and when this is the case, the ESCU can also be quickly replaced to minimize down time of the aircraft.

Figure 4A:
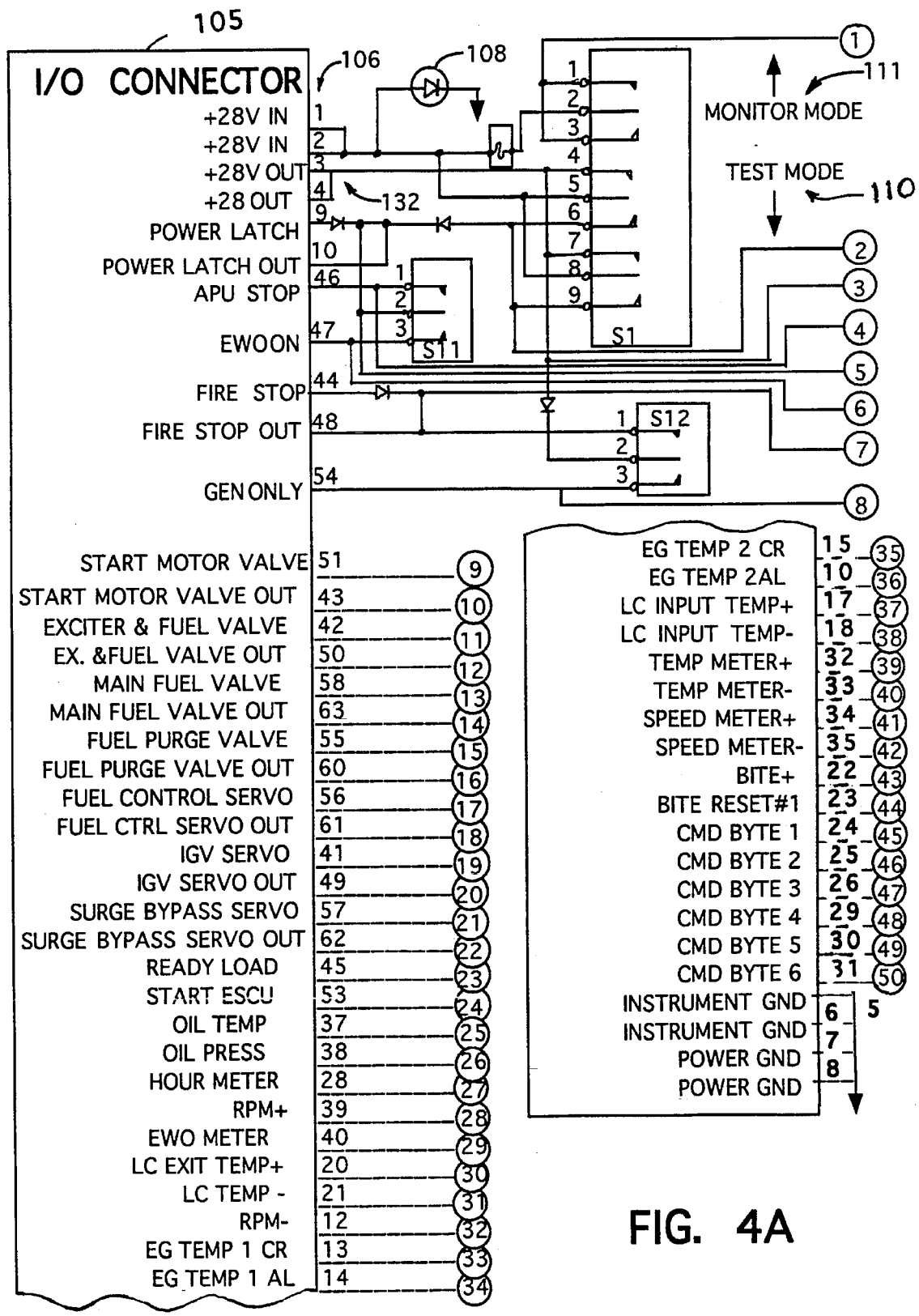
FIGS. 4A through 4E are circuit drawings of the above embodiment.

FIGS. 4A, B, C, D, and E are the circuit diagrams of the APU Tester. The APU Tester is shown in FIG. 6B connected to an APU to test portions of the unit. Cable 160 permits the APU Tester to be electrically inserted in between (1) operator directed controls 162 and one of the ESCU's 164 and (2) the ESCU and the corresponding group of LRU's 166. APU Tester cable connectors are equivalent to the APU cable connectors so the connections can be made very quickly. Each of APU Tester cable connectors J1, J2, P2, and P4 is a 41-pin connector. J1 and P2 provide connections to the following signals: Fuel Purge Valve, Exciter & Fuel Valve, Main Fuel Valve, Fuel Control Servo, IGV Servo, Surge Bypass Servo, Oil Pressure, Oil Temperature, Hour Meter, EWO Hour Meter, EG Temp 1, EG Temp 2, Engine Speed, LC Input Temp, and LC Exit Temp.

APU Tester cable connector J2 and P4 pick up the following signals from the ESCU: Start Motor Hydraulic Valve, Start ESCU, Fire Stop, APU Stop, Generator Only, Ready Load, EWO on, Power Latch, Temp Meter, Speed Meter, BITE, BITE Reset 1, CMD BITE 1 through 6, +28 VDC, and Ground.

Figure 2:
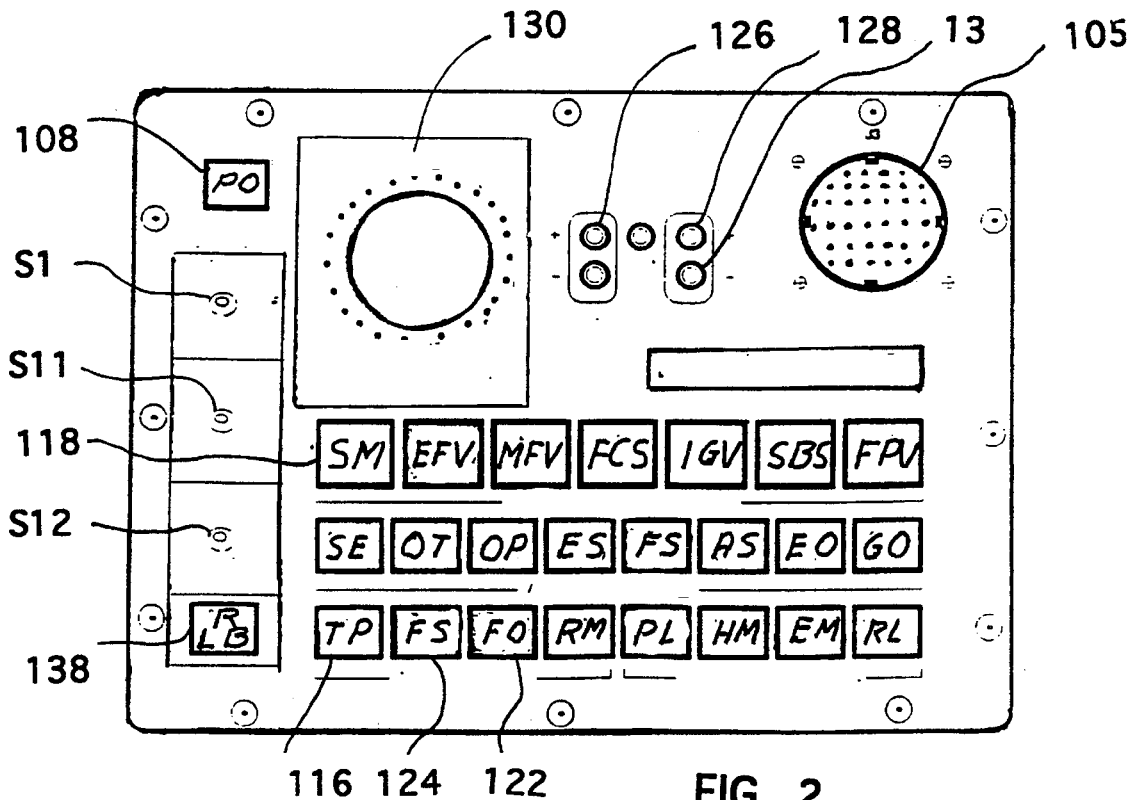
FIG. 2 is a drawing of the front panel of an embodiment of the present invention.

Cable 160 is connected to the APU Tester via a 66 pin I/O connector 105 as shown in FIG. 2. The signals and their corresponding pin numbers are shown in FIG. 4A.

Figure 4B:
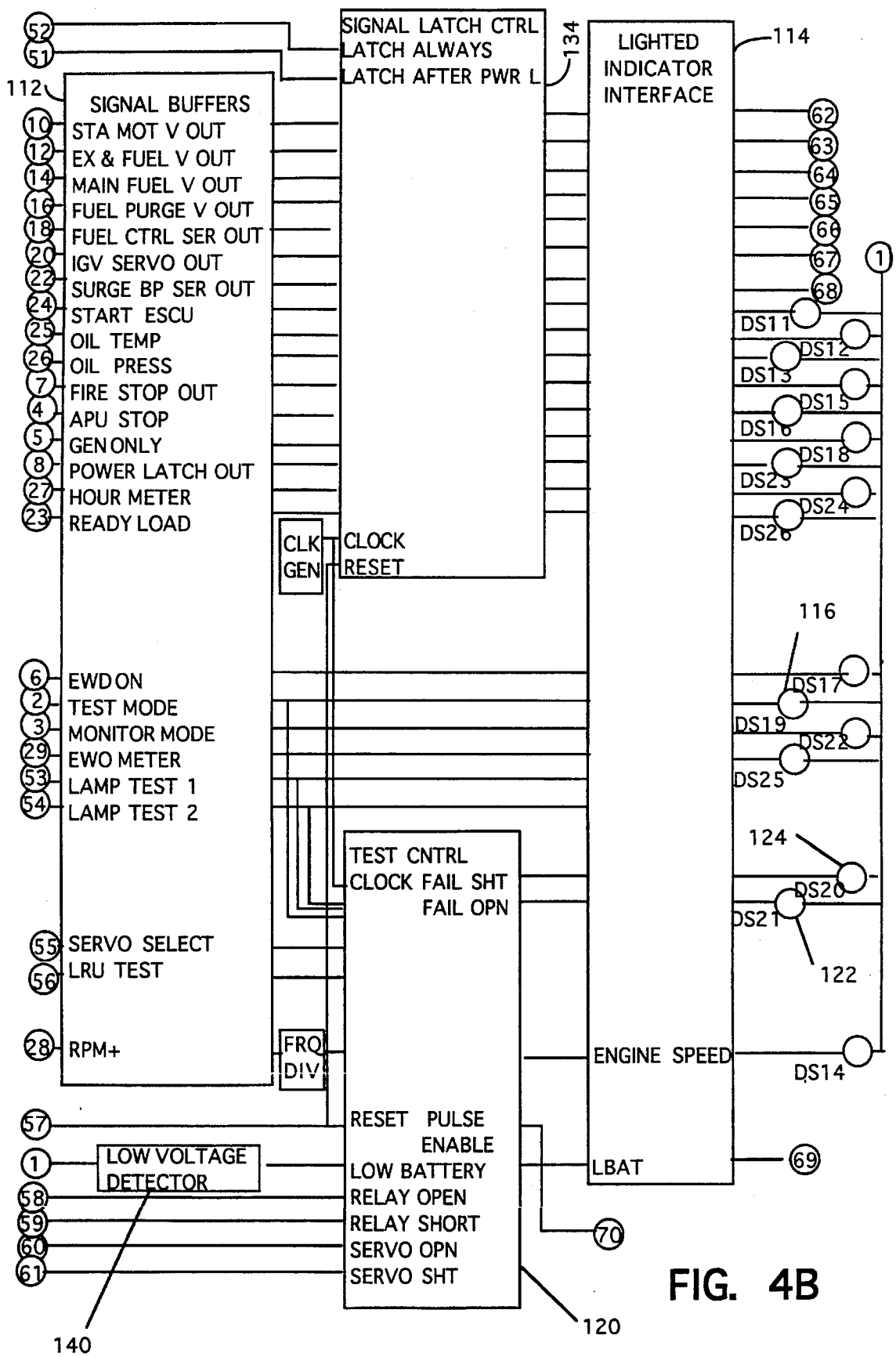

Electrical circuits of the APU Tester are shown in FIGS. 4A, B, C, D, and E. The control panel of the APU Tester is shown in FIG. 2. The principal electronic components of the APU Tester are:

(1) Test control circuit 120 as shown in FIG. 4B controls the pulse testing function. This circuit is supplied by Altera Corp. of San Jose Calif. as Part No. EP910DC-40.

(2) Signal latch control circuit 134 as shown in FIG. 4B which is supplied by Altera as Part No. EP910DC-40.

(3) Light indicator interface 114, supplied by Texas Instruments as Part No. ULN2003AN.

(4) 28 Volt pulse generator 102 Which utilizes a Darlington transistor supplied by Texas Instruments as P/N TIP115.

Figure 4C:
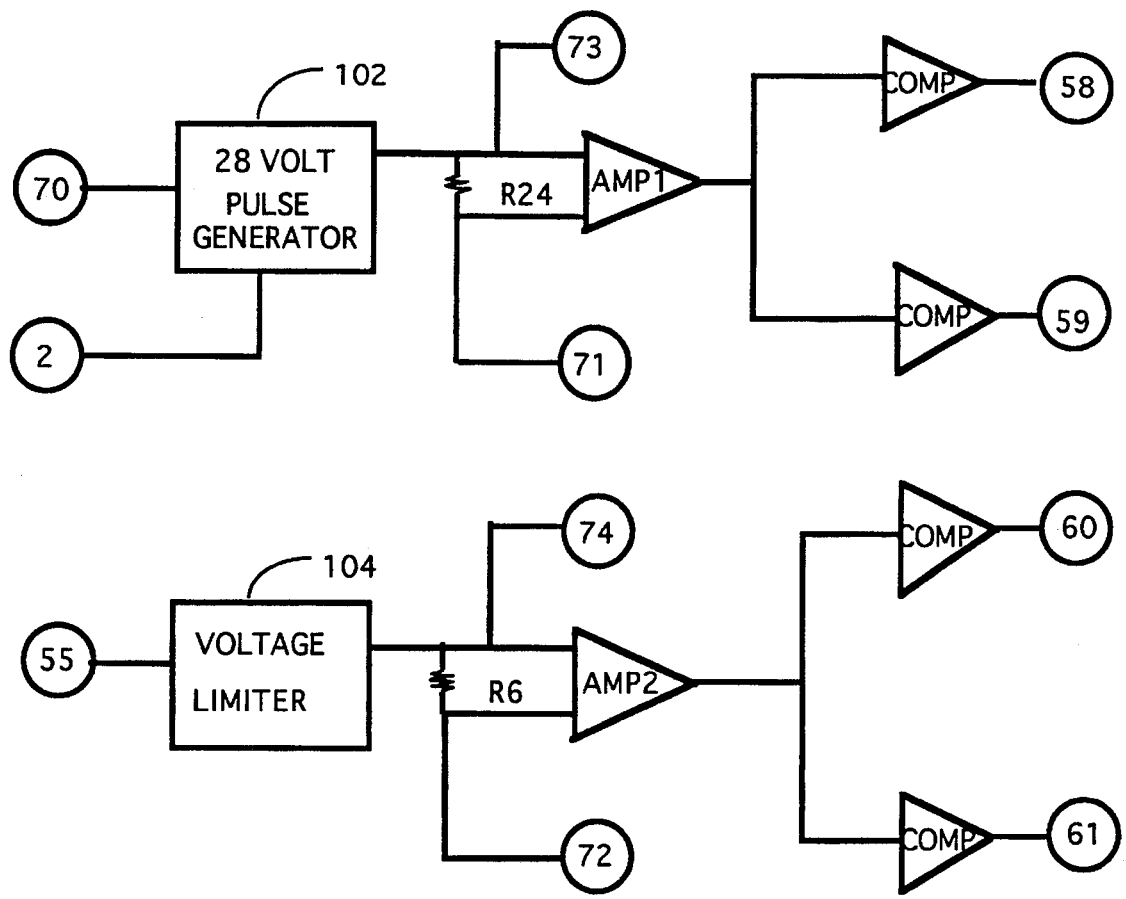
Figure 4D:
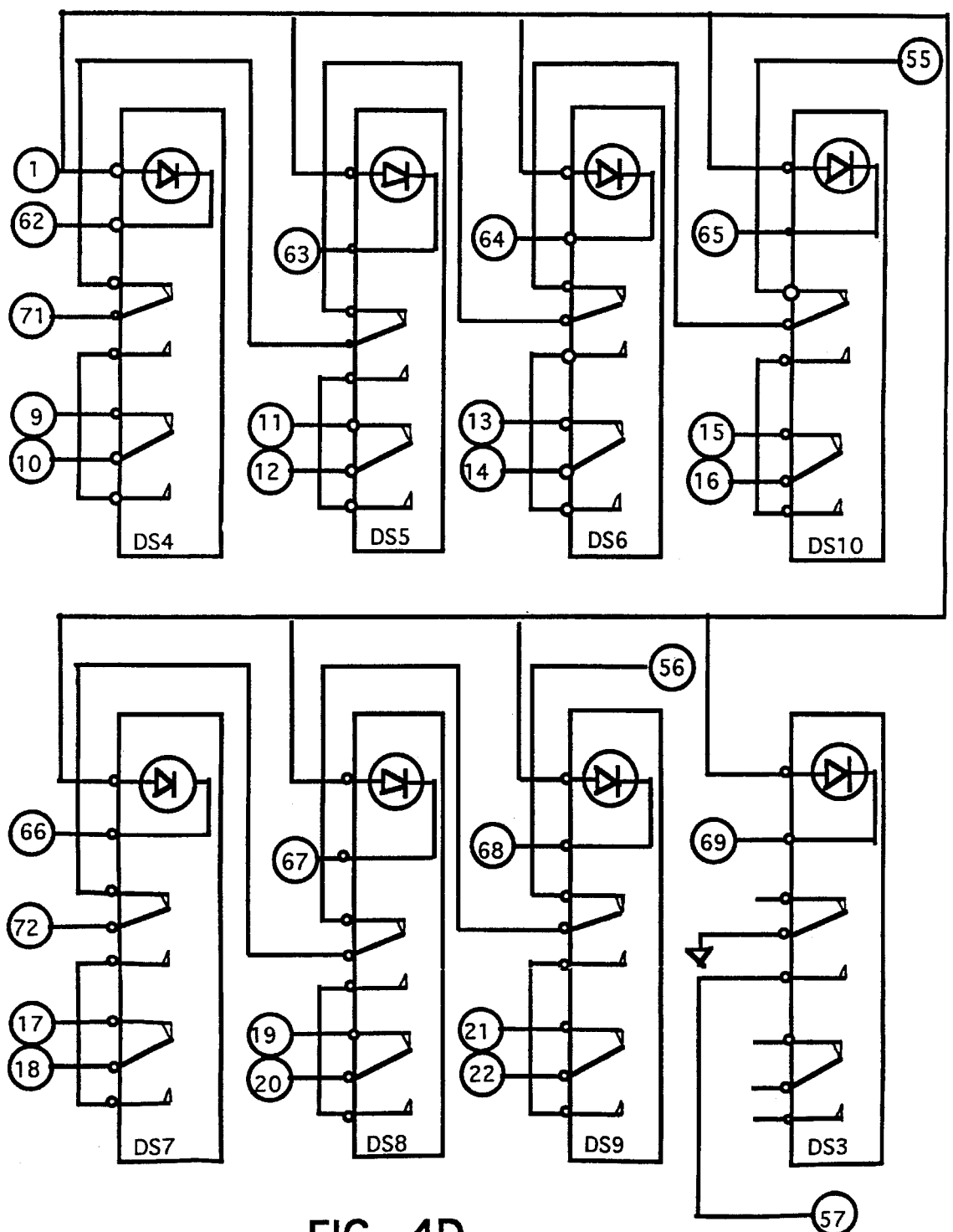
Figure 4E:
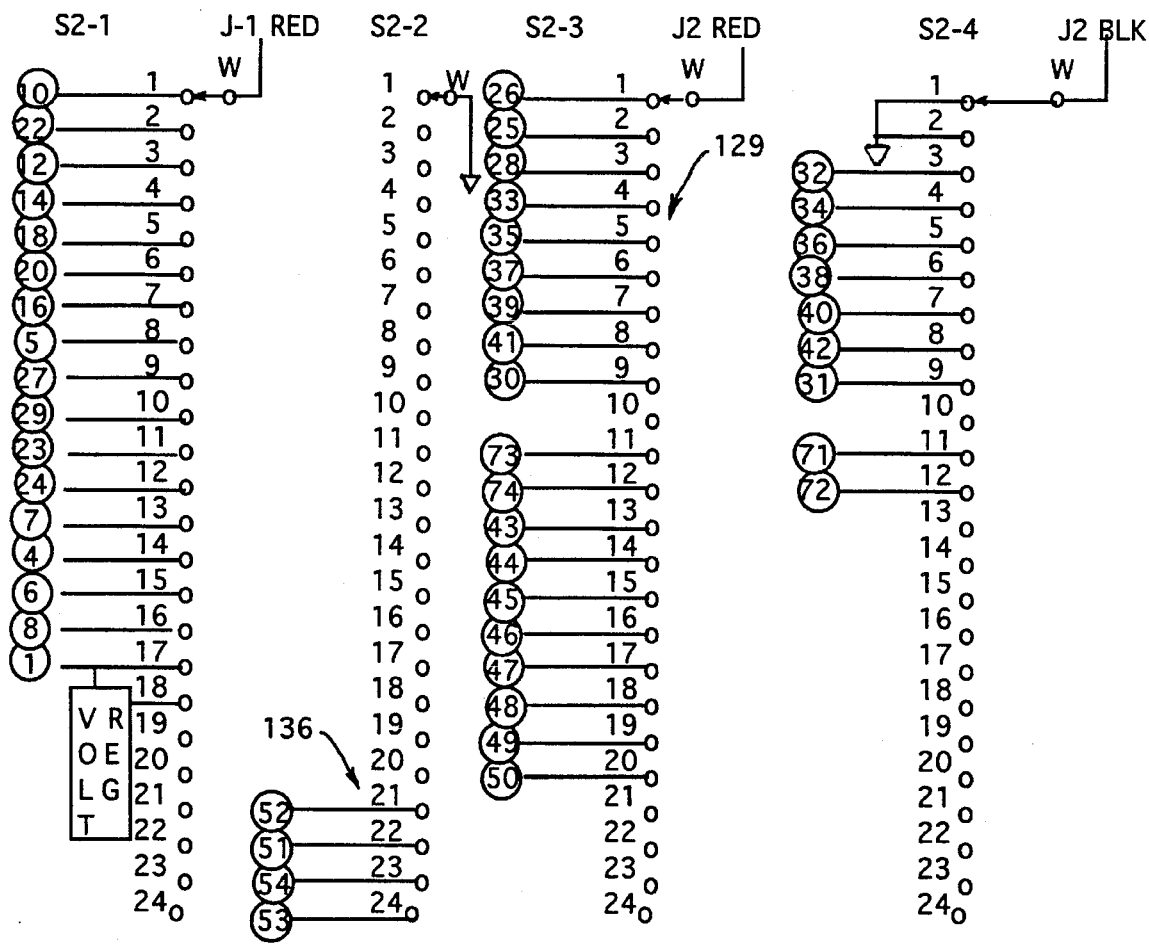

(5) A four-deck, 24 position signal selector switch 130 shown on FIG. 2 and indicated as switch S2 on FIG. 4E.

(6) Test jacks 126, 128, and 130 permit oscilloscope and other monitoring of APU signals.

FIG. 4A shows the interface circuitry for the power, ground, fire stop, power latch, APU stop, EWO ON, and GEN ONLY signals; and the interconnects between the three control switches S1, S11, and S12. FIG. 4B depicts the programmable logic, the lighted indicators interface and the wiring for the lighted indicators. FIG. 4C shows the current measuring circuits. FIGS. 4D shows the wiring for the LRU test buttons and the reset button. FIG. 4E shows the wiring for the test selector switch.

Figure 1:
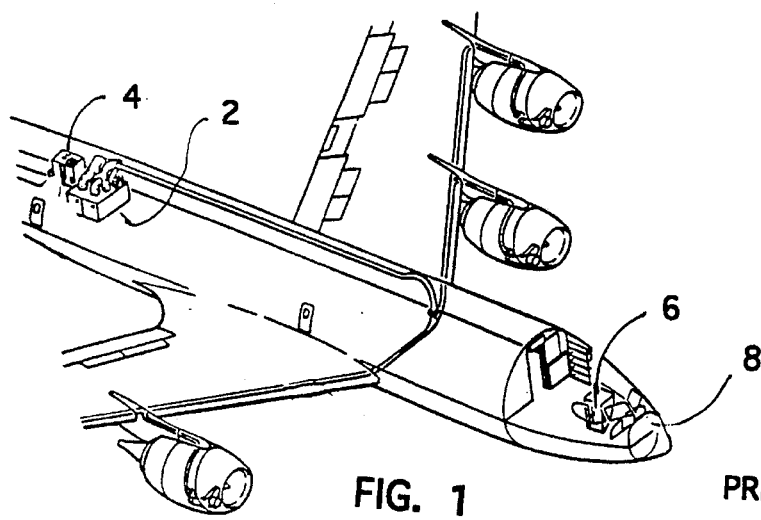
FIG. 1 is a partially cutaway drawing of an aircraft showing locations of APU equipment.
Figure 1A:
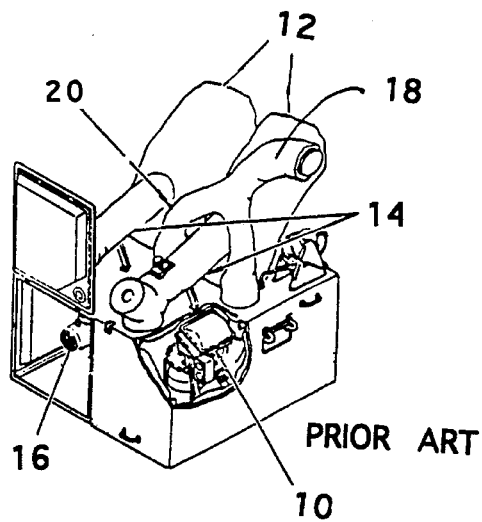
FIGS. 1A and 1B are drawings of APU equipment.
Figure 1B:
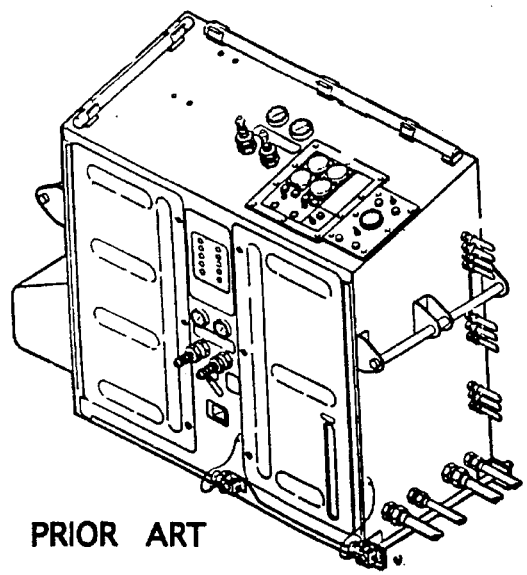
Figure 5:
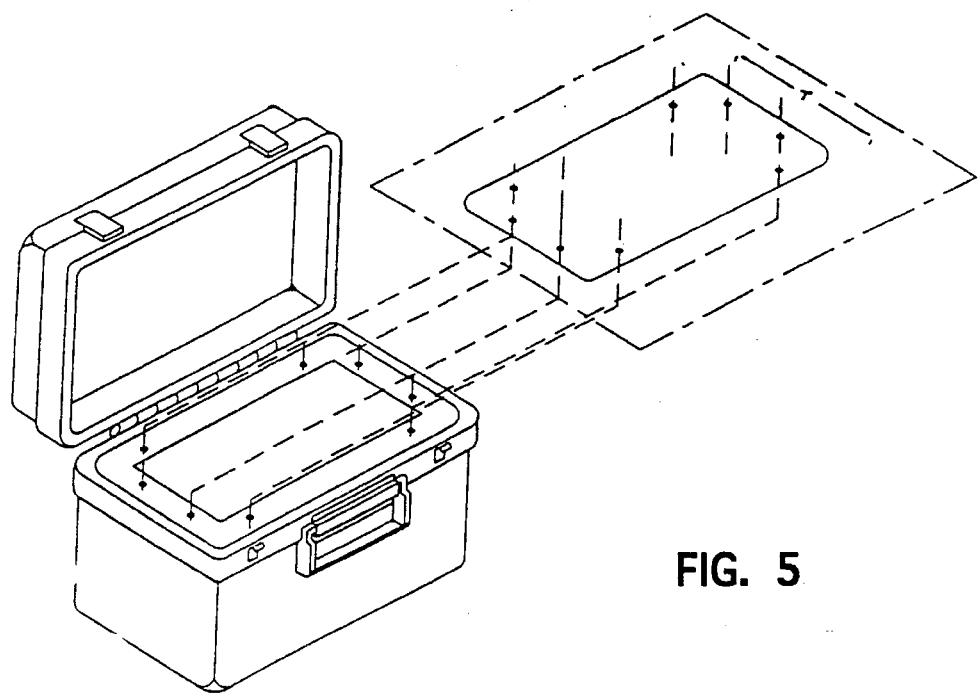
FIG. 5 is a drawing of the case for the above embodiment.
Figure 6A:
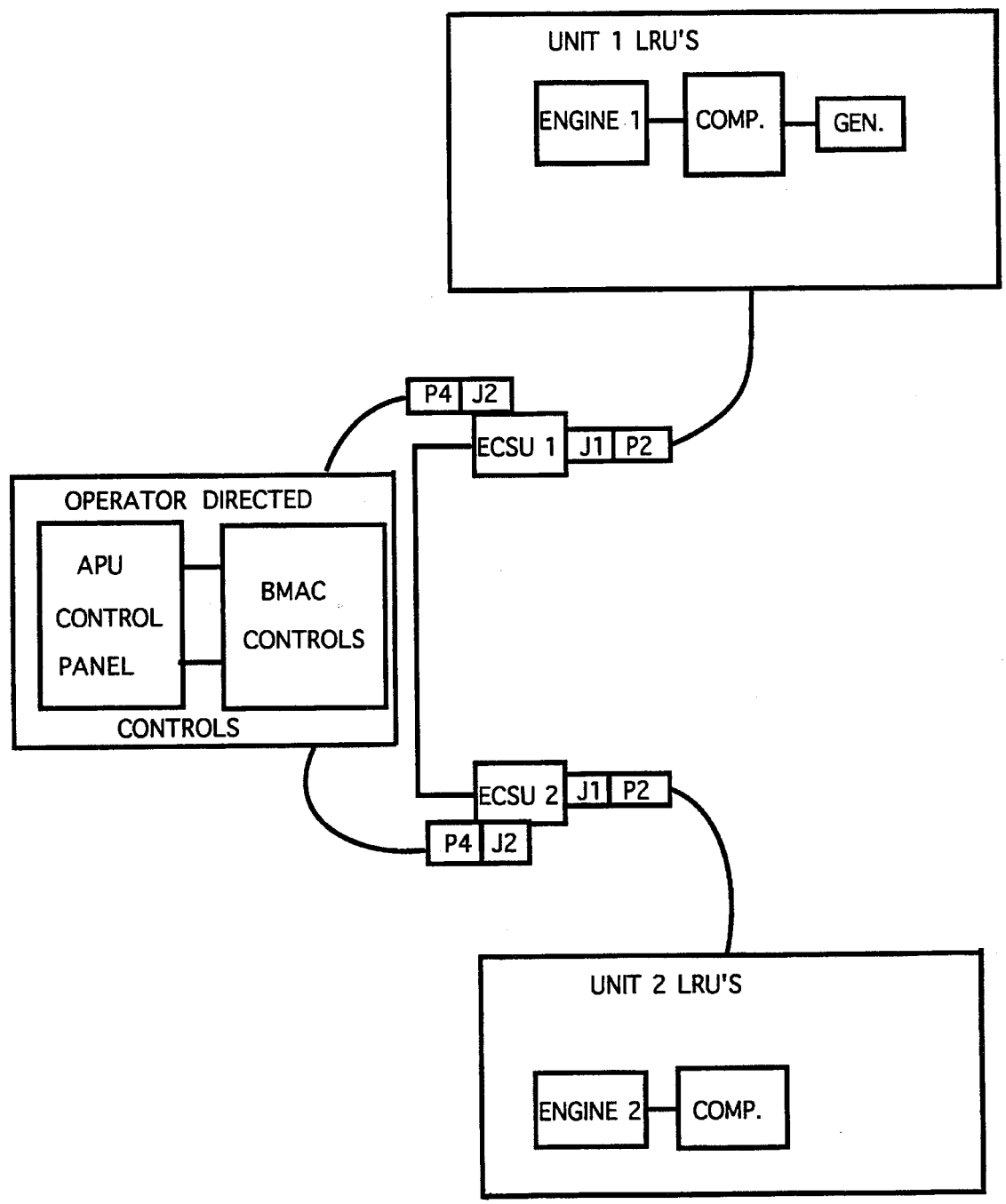
FIG. 6A shows normal connections between APU equipment.
Figure 6B:
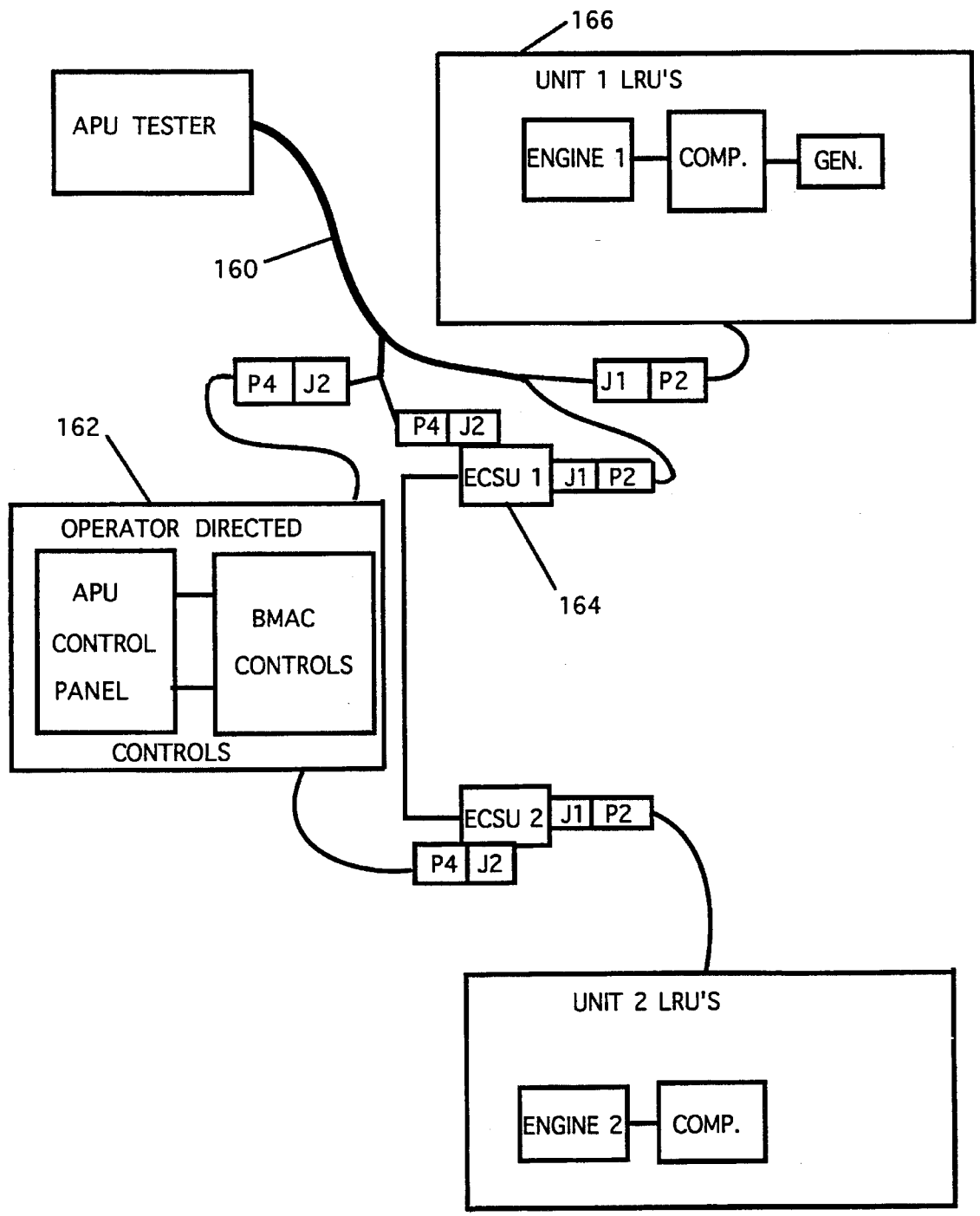
FIG. 6B shows the wiring setup to utilize the above embodiment to test the APU equipment.

FIG. 5 is a drawing of the case for the APU tester showing it and its compact features. The complete unit weighs no more than 10 pounds.

How to Test the KC135R APU

All of the principal components of the T40LC-2 APU can be tested very conveniently with the above described embodiment of the present invention. The APU Tester is designed to operate in three modes. These modes are referred to as a "Test Mode", a "Monitor Mode"; and a "Breakout Box Mode". Each of these modes of testing is described below:

Test Mode

In the Test Mode the APU Tester will electrically command and operate LRU components while the turbines are inactive. In this mode, circuits are tested individually. The APU Tester is connected to the T40LC-2 APU as shown in FIG. 6B using the cable provided with the APU Tester. In the test mode, as indicated at 110 on FIG. 4A, the contacts on switch S1 are in the down position. The following LRU's can be tested in this mode:

|  | FIG. 4D | FIG. 2 |
|---|---|---|
| Starter Motor Hydraulic Valve | (DS-4) | SM |
| Exciter & Fuel Valve | (DS-5) | EFV |
| Main Fuel Valve | (DS-6) | MFV |
| Fuel Control Servo | (DS-7) | FCS |
| IGV Servo | (DS-8) | IGV |
| Surge Bypass Servo | (DS-9) | SBS |
| Fuel Purge Valve | (DS-10) | FPV |

As each of the seven LRU's is tested by pushing the LRU two pole double throw test button as shown on FIG. 2 corresponding to the LRU being tested as shown on FIG. 4D, the APU Tester will send a low voltage short pulse to the selected LRU. For example LRU Test Button DS-4 corresponds to the Start Motor Valve, DS-5 is the Exciter & Fuel Valve. These are indicated in the above table. In the case of the Starter Motor Hydraulic Valve, Exciter and Fuel valve, Main Valve, and the Fuel Purge Valve; the voltage is 28 volts DC. For the Fuel Control Servo, the IGV Servo, and the Surge Bypass Servo; the voltage pulse is 10 volts DC. This is accomplished as shown in FIGS. 4C and 4D. The 28 volts is produced by a 28 Volt pulse generator 102 as shown on FIG. 4C. The pulse path follows a line indicated by on and off page designator 71 as shown on FIG. 4C and correspondingly on FIG. 4D. The signal daisy chains through the four switches as indicated at the top of FIG. 4D to designator 55 then through voltage limiter 104 as shown on FIG. 4C to provide a reduced voltage pulse of 10 volts for the three switches as shown at the bottom of FIG. 4D. The duration of the voltage pulse is 50 milliseconds unless the LRU is detected as shorted, in which case the pulse duration will be reduced to 20 milliseconds. The 28 VDC pulse is limited to 1.2 amps maximum, and the 10 VDC pulse is limited to 0.6 amps maximum.

In this test mode the APU Tester switches are set as follows with the switch numbers indicated in parenthesis and designated on FIGS. 2 and 4A:

| SWITCH | | SETTING |
|---|---|---|
| LRU TEST/MONITOR MODE | (S1) | LRU TEST |
| EWO ON/APU STOP | (S11) | OFF |
| GEN ONLY/FIRE STOP | (S12) | OFF |

With the APU off all indicators on the APU tester are off. When the APU is switched on, 28 volts DC from the APU supply battery enters the APU Tester through pins 1 and 2 as shown at 106 in FIG. 4A of I/O Connector 105. The I/O connector is shown at upper right corner of FIG. 2. The signals corresponding to numbered pins of the connector are shown on FIG. 4A. The 28 volts DC turns on the Power On indicator 108 and is routed to the Test Power Indicator 116 (see FIG. 4B) via switch S1. Since switch S1 is in the "down" position, the signal is routed from pins 5 and 8 to pins 6 and 9 and, as indicated by page designator 2 on FIG. 4A and on FIG. 4B, through signal buffers 112 and the lighted indicator interface 114 (also shown in FIG. 4B) to DS 19. In this mode the 28 volt DC signal is prevented from reaching the I/O connector 105 pins 3 and 4 by the position of S1 as shown in FIG. 4A. This prevents the 28 Volts from reaching the ESCU to activate start sequence and allows the LRU's to be tested with the APU turbine inactive.

At this point any of the LRU's can be tested. Power to 28 Volt pulse generator is provided via I/O connector pins 1 and 2 through switch S1 via as shown by following page designator 2 (FIGS. 4A and 4C). For example, to test the Starter Motor Hydraulic Valve, switch DS4 (as shown in FIG. 4D and at 118 on FIG. 2) is depressed. This routes the relay test pulse at push button switch DS4 out to the Starter Motor Hydraulic Valve. The path the test pulse follows begins at the pulse generator 102 shown in FIG. 4C. Following designator 71 (FIGS. 4C and 4D) the pulse continues through switch DS4, which is in the "down" position, to designator 10 (FIGS. 4D and 4A) and out to Starter Motor Valve via I/O connector 105 as shown as "Starter Motor Valve Out" on FIG. 4A. Before any of the LRU test switches are depressed the test signal is daisy-chained through all switches (DS4–DS 10) as shown in FIGS. 4 D and into the test control circuitry 120 as shown on FIG. 4B via the signal buffer 112 as shown by following designators 55 and 56 on FIGS. 4D and 4B. When any LRU test switch is depressed the test control circuitry senses the removal of the test signal, activates the pulse enable signal, and starts an internal timer built inside the test control circuitry. Following the path from FIG. 4B to FIG. 4C through designator 70, a test pulse is generated by the pulse generator 102 when the pulse enable signal is activated. The test pulse current drawn by Starter Motor Hydraulic Valve is measured by amplifier AMP 1 as shown in FIG. 4C. The amplifier outputs a signal proportional to the test pulse current to its two comparators.

If the current is less than 0.1 amps the Relay Open signal is sent to the test control circuitry 120 as indicated by page designator 58 on FIGS. 4B and 4C. If the current is greater than 1.0 amp the Relay Shorted signal is sent as indicated via designator 59 on FIGS. 4B and 4C. If the test control circuitry receives the Relay Open signal it outputs a signal to light the Fail Open Indicator DS21 as shown on FIG. 4B and as shown at 122 on FIG. 2. If the Relay Shorted signal is received, the test control circuitry outputs a signal to light the Fail Short indicator (DS20) (see FIG. 4B at 124) and immediately deactivates the Pulse Enable signal to turn off the test pulse. If the current is under 1 amp the test pulse timer in the test control circuitry will time out after 50 milliseconds and Pulse Enable signal will turn off the test pulse. The test control circuitry 120 used in this embodiment is Part No. EP910DC-40 supplied by Altera Corp. of San Jose Calif. It is an integrated circuit which was modified, in accordance with instructions available with the part, to perform the functions described above.

The Fuel Purge Valve (DS10), the Exciter & Fuel Valve (DS5), and the Main Fuel Valve (DS6) are tested using the same method as described above for the Starter Motor Hydraulic Valve.

The Fuel Control Servo (DS 7) is tested using a method similar to that described for the Starter Motor Hydraulic Valve. The main difference is that the 28 volt DC test pulse generated is reduced to 10 volts DC using the voltage limiter 104 as shown in FIG. 4C. The other difference is in the circuitry used to measure the current. The test pulse current drawn by the Fuel Control Servo is measured by amplifier AMP 2. The amplifier outputs a signal proportional to the test pulse current to its two comparators. If the current is less than 50 milliamps, the Servo Open signal is sent to the test control circuitry. If the current is greater than 200 milliamps the Servo Shorted signal is sent. If the test control circuitry receives the Servo Open signal it outputs a signal to light the Fail Open indicator. If the Servo Shorted signal is received, the test control circuitry outputs a signal to light the Fail Short indicator and immediately deactivates the Pulse Enable signal to turn off the test pulse. If the current is under 200 milliamps then the test pulse timer in the test control circuitry will time out after 50 milliseconds and the Pulse Enable signal will turn off the test pulse. The IGV Servo (DS8) and the Surge Bypass Servo (DS9) are tested using an identical method as the Fuel Control Servo.

Oscilloscope Readings

The Test Mode also allows the APU Tester to obtain oscilloscope readings of test signals for the following LRU's:

Starter Motor Hydraulic Valve

Fuel Purge Valve

Exciter & Fuel Valve

Main Fuel Valve

Fuel Control Servo

IGV Servo

Surge Bypass Servo

LRU Relay Test Pulse

LRU Servo Test Pulse

Switch S2 (FIG. 4E) is used to select the signal to be observed. The signals on deck 1 of S2 (S2-1) are measured from test jack J1 red 126 as shown on FIG. 2 to ground. The signals between S2-3-1 and S2-3-12 as shown at 129 on FIG. 4E are measured from test jack J2 red 128, as shown on FIG. 2, to J2 black 131. The signals between S2-3-13 and S2-3-20 are measured from test jack J2 red 128 to ground.

MONITOR MODE

The Monitor Mode of the APU Tester (switch S1 in "up" position as shown at 111 on FIG. 4A) provides lighted indicators to visually display when the ESCU signals are being applied to, or received from the various LRU's and remote sensors. In addition, a test selector switch permits the connection of external test instruments to any of the ESCU input or output signals during test.

While in the Monitor Mode two display storage modes are available. Each storage mode is accessed by using the Test Point Selector Switch, FIG. 4E and also shown at 130 on FIG. 2. In position 21, signals from the component listed in the table below will be stored (i.e., the light located on the front panel as shown in FIG. 2 corresponding to the component [and indicated by the initials of the respective component] will turn on and remain on until the reset button is pushed) any time they become active. In position 22 the signal will be stored only after the Power Latch signal has been issued by the ESCU. In all other positions of the Test Point Selector Switch no signal storage will occur. In the storage modes, only the following signals are stored:

| Start Motor Valve | Start ESCU | Oil Pressure | Fuel Control Servo |
|---|---|---|---|
| Surge Bypass Servo | Fire Stop | Oil Temp. | IGV Servo |
| Exciter & Fuel Valve | APU Stop | Hour Meter | Fuel Purge Valve |
| Main Fuel Valve | Generator Only | Ready Load | Power Latch Output |

The purpose of the signal storage feature is to allow fault isolation if shutdown occurs during the APU start up sequence. In the Display Store Mode (position 21) the APU Tester will latch all signals and therefore display all signals issued by the ESCU before shutdown. As a normal part of its testing function, the ESCU regularly issues LRU signals before the APU start sequence to insure the proper resistance of the electric circuits of the LRU equipment. The Store After Power Latch Mode (position 22) will allow storage of all signals issued after the Power Latch signal and before shutdown. The purpose of this mode is to eliminate the latching of the LRU test signals issued before the actual APU startup sequence.

The following additional lighted indicators are also provided on the front panel as shown in FIG. 2 by their respective abbreviations in Monitor Mode:

| EWO Signal | Power On | Low Battery |
|---|---|---|
| EWO Hour Meter Signal | Test Power | |
| Engine Speed | Run Mode | |

The EWO and EWO Hour Meter signals display the operating condition of these ESCU inputs and outputs. The engine speed indicator is provided to display the engine speed with a flashing rate that is proportional to the speed. The Power On indicator is on any time+28 VDC is applied. Test Power indicates the LRU Test Mode, and Run Mode indicates the Monitor Mode. The Low Battery indicator will turn ON and latch whenever the APU battery voltage drops below 16.5 VDC. A reset switch is provided to reset the low voltage indicator.

For operation in the Monitor Mode, the APU Tester is connected between the ESCU and the turbine assembly's LRU's and remote sensors as shown in FIG. 6B. The APU Tester switches are set as follows:

| LRU TEST/MONITOR MODE SWITCH | (S1) | MONITOR MODE |
|---|---|---|
| EWO ON/APU STOP SWITCH | (S11) | OFF |
| GEN ONLY/FIRE STOP SWITCH | (S12) | OFF |

With the APU off, all indicators on the APU Tester are off. When the APU is started, 28 Volts DC enters the APU Tester through the test connector pins 1 and 2 as shown at 106 in FIG. 4A. The 28 Volt DC turns on the Power On indicator 108 and the Run Mode indicator (DS22) as shown in FIG. 4B via S1 pins 4 and 7, the signal buffers 112, and the lighted indicator interlace 114 (as shown in FIG. 4B). The 28 Volt DC signal is also routed through S1 and back out the I/O connector 105 through pins 3 and 4 as shown at 132 on FIG. 4A. This allows the APU start sequence to continue normally. At this point all signals between the ESCU and the various LRU's and remote sensors will cause a light indicator on the front panel (FIG. 2) to become illuminated whenever that signal becomes active. The 16 latchable signals listed above are reduced to a level of 5 Volts DC using the signal buffer circuits at 112 in FIG. 4B. The inputs represented by the lines on the left side of signal buffer 112 vary from 0 to 28 Volts. Circuitry provided in signal buffer 112 reduce the signal proportionally to 0 to 5 Volts represented by the lines on the right side of signal buffer 112. The corresponding outputs of the signal latch control circuitry 134 drive the lighted indicator buffers 114. The Engine Speed signal is the only repetitive signal and is buffered as shown at A in FIG. 4B. This 0–4000 HZ signal is then divided down by using a frequency divider (Part # LS 393 to) to 0–250 Hz and further conditioned by test control circuitry to provide an output of 0 to 10 pulses per second to indicator DS 14. The two remaining APU signals, EWO On and EWO Hour Meter, connect to indicators DS17 and DS25 after being buffered by signal buffers.

While in the Monitor Mode the APU Tester can also latch any of the 16 latchable signals listed above. There are two methods of accomplishing this latching. In the Display Store Mode, S2 is placed in position 21 as shown at 136 on FIG. 4E providing a ground signal through S2-2-21 to (follow page designator 52) the signal latch control circuitry (as shown in FIG. 4B). This circuitry will then latch any of the 16 above listed signals as they become active. In the Store After Latch Mode, S2 is placed in position 22 as shown at 136 in FIG. 4E providing a ground signal through S2-2-22 to (follow designator 51) the signal latch control circuitry 134 on FIG. 4B. This circuitry will then latch any of the 16 above listed signals only after the Power Latch signal has been issued. In either case the indicators can be turned off by pushing the RESET switch (DS3) 138 on FIG. 2 and as shown in FIG. 4D. The reset button also houses the low battery indicator referred to above. This signal latch control circuitry 134, like the test control circuitry 120 discussed above, consists of an Altera Corp Part No. EP910DC-40 chip modified in accordance with instructions provided with the chip to perform the functions described above.

The APU battery is automatically and continuously monitored by the low voltage detector circuitry as shown at 140 in FIG. 4B. If the battery voltage drops below 16.5 Volts DC, the comparator outputs a signal that is latched by the test control circuitry and sent to the Low Voltage indicator (DS3) as indicated in FIG. 4D (by following page designator 69). This indicator is also turned off by pushing the RESET switch.

Oscilloscope Testing in Monitor Mode The APU Tester permits oscilloscope testing in the Monitor Mode. The following signals can be monitored:

Starter Motor Hydraulic Valve

Fuel Purge Valve

Exciter & Fuel Valve

Main Fuel Valve

Fuel Control Servo

IGV Servo

Surge Bypass Servo

Power Latch

Hour Meter

EWO Meter

Ready Load

Start ESCU

Fire Stop

APU Stop

EWO On

Generator Only

Oil Pressure

Oil Temperature

Engine Speed

EG Temp 1

EG Temp 2

LC Input Temp

Temp Meter

Speed Meter

LC Exit Temp

Bite

Bite Reset 1

CMD Bit 1 through 6

Switch S2 (FIG. 4E) is used to select the signal to be measured. The signals on deck 2 of S2 (S2-1) are measured from test jack J1 red to ground. The signals between S2-3-13 and S2-3-20 are measured from test jack J2 red to return or ground. The signals between S2-3-1 and S2-3-12 are measured from test jack J2 red to J2 black.

BREAKOUT BOX MODE

In the Breakout Box Mode the APU Tester is used to connect an ohmmeter via test jacks to any of the control function lines, signal lines, or sense lines in order to measure the resistance of APU circuitry. The resistance of any of the 33 APU circuits listed in the above section of this specification can be measured.

For operation in the Breakout Box mode the APU Tester is connected as described above for the Monitor Mode. The APU Test switches are set as follows:

| SWITCH | SETTING | |
|---|---|---|
| LRU TEST/MONITOR MODE | (S1) | CENTER POSITION |
| EWO ON/APU STOP | (S11) | OFF |
| GEN ONLY/FIRE STOP | (S12) | OFF |

Since the APU must remain off in this mode, all indicators on the APU Tester will be off. Switch S2 (FIG. 4E) 130 on FIG. 2 is used to select the circuit to be measured. The signals on deck 1 of S2 (S2-1) are measured from test jack J1 red to ground. The signals between S2-3-13 and S2-3-12 are measured from test jack J2 red to J2 black. The signals between S2-3-13 and S2-3-20 are measured from test jack J2 red to ground.

Other Switch Functions

The remaining functions of the EWO ON/APU STOP switch and the GEN ONLY/FIRE STOP switch are duplicate APU functions provided for the convenience of the operator. These two momentary toggle switches, S11 and S12 as shown on FIG. 4A and FIG. 2 provide an alternate means to generate the EWO ON, APU STOP, GEN ONLY and FIRE STOP signals that are normally activated using the APU control panel.

While the above description contains many specificities, the reader should not construe these as limitations on the scope of the invention, but merely as exemplifications of preferred embodiments thereof. Those skilled in the art will envision many other possible variations which are within its scope. For example, the concepts described above can be applied by persons skilled in the art to provide testers for APU's other than the T40LC-2 APU. Accordingly the reader is requested to determine the scope of the invention by the appended claims and by their legal equivalents, and not by the given examples.

We claim:

1. An auxiliary power unit testing device for testing aircraft auxiliary power units having an operator directed control station connected, by a first multiwire electrical cable having at least one multipin connector, to an electronic sequencing control unit, ESCU, which is connected, by a second multiwire electrical cable having at least one multipin connector, to at least one set of compressor and generating equipment comprising line replaceable units, LRU's, said testing device comprising:

A) a APU testing case,

B) an open-short circuit testing means contained in said testing case for testing for open and short circuits in LRU electrical circuits by subjecting said LRU electrical circuits with short electrical pulses and detecting the resulting flowing current, C) an electrical cabling means extending from said testing case for electrically imposing said open short-circuit testing means in between said operator directed control station and said ESCU and in between said ESCU and said LRU's, and D) a selector means located on said testing case for selecting electrical circuits for electrical monitoring, said selector means comprising:
 1) at least one selector switch and
 2) at least one test jack means for connecting electrical monitoring equipment such as voltmeters and oscilloscopes.

2. A testing device as in claim 1 wherein said open-short circuit testing means comprises a pulse generator and two current comparators.

3. A testing device as in claim 1 and further comprising a plurality of signal buffer circuit means and a plurality of signal latch control circuit means for providing a record indicating if electrical signals are transmitted to line replaceable units.

4. A testing device as in claim 3 wherein said record is in the form of a plurality of lights.

5. A testing device as in claim 4 wherein said plurality of lights are light emitting diodes.

6. A testing device as in claim 4 wherein said plurality of lights are incandescent lamps.

7. A testing device as in claim 1 wherein said electrical cabling means provide a connection with a battery source in said auxiliary power units in order to provide power for operation of said testing device.

* * * * *